United States Patent
Kondo et al.

(10) Patent No.: US 6,855,625 B2
(45) Date of Patent: Feb. 15, 2005

(54) MANUFACTURING METHOD OF MULTILAYER SUBSTRATE

(75) Inventors: Koji Kondo, Toyohashi (JP); Tetsuaki Kamiya, Nagoya (JP); Toshikazu Harada, Kariya (JP); Ryuichi Onoda, Kariya (JP); Yasutaka Kamiya, Nishio (JP); Gentaro Masuda, Kasugai (JP); Yoshitaro Yazaki, Anjo (JP); Tomohiro Yokochi, Obu (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/458,630

(22) Filed: Jun. 11, 2003

(65) Prior Publication Data

US 2003/0209796 A1 Nov. 13, 2003

Related U.S. Application Data

(62) Division of application No. 10/007,703, filed on Dec. 10, 2001, now Pat. No. 6,667,443.

(30) Foreign Application Priority Data

Dec. 14, 2000 (JP) ....................... 2000-380634
Jun. 27, 2001 (JP) ....................... 2001-195375
Oct. 30, 2001 (JP) ....................... 2001-333021

(51) Int. Cl.$^7$ ............................ H01L 21/47; H05K 1/11
(52) U.S. Cl. ................ 438/622; 438/618; 438/623; 438/624; 438/108; 438/778; 438/197; 156/242; 156/280; 156/150; 156/257; 174/262; 174/264; 174/266; 174/261
(58) Field of Search ................................ 156/240–247, 156/257, 280, 150, 230; 174/262–266; 438/622, 458, 618, 14, 778, 197, 678, 623, 624, 108, 637, 620

(56) References Cited

U.S. PATENT DOCUMENTS

| 2,736,677 | A | 2/1956 | Eisler |
| 4,763,403 | A | 8/1988 | Klein et al. |
| 4,915,983 | A | 4/1990 | Lake et al. |
| 5,478,972 | A | 12/1995 | Mizutani et al. |
| 5,865,934 | A | 2/1999 | Yamamoto et al. |
| 6,228,467 | B1 | 5/2001 | Taniguchi et al. |
| 6,320,140 | B1 * | 11/2001 | Enomoto ............. 174/264 |
| 6,586,686 | B1 * | 7/2003 | Enomoto et al. ...... 174/262 |

FOREIGN PATENT DOCUMENTS

| GB | 1 430 640 | 3/1976 |
| JP | A-5-198946 | 8/1993 |
| JP | A-7-263867 | 10/1995 |
| JP | A-9-199635 | 7/1997 |
| JP | A-9-275273 | 10/1997 |
| JP | A-10-341082 | 12/1998 |
| JP | A-2000-101248 | 4/2000 |
| JP | A-2000-200976 | 7/2000 |
| JP | A-2000-277924 | 10/2000 |
| JP | A-2000-323839 | 11/2000 |

* cited by examiner

*Primary Examiner*—Matthew Smith
*Assistant Examiner*—Igwe U. Anya
(74) *Attorney, Agent, or Firm*—Posz & Bethards, PLC

(57) ABSTRACT

Single-sided conductor patterned films are prepared, each of which has a conductor pattern formed only one side of a resin film and via hole filled with conductive paste. A single-sided conductor patterned film which has a conductor pattern formed only one side of a resin film and an opening formed in the resin film so as to expose an electrode is laminated on the single-sided conductor patterned films. Moreover, a cover layer with an opening to expose an electrode is laminated on a bottom surface of the single-sided conductor patterned films to form a laminate. Then, by pressing while heating the laminate, a multilayer substrate having the electrodes at both sides thereof can be produced.

27 Claims, 7 Drawing Sheets

MANUFACTURING METHOD OF MULTILAYER SUBSTRATE

CROSS REFERENCE TO RELATED APPLICATIONS

This application is a divisional of Ser. No. 10/007,703, filed Dec. 10, 2001 now U.S. Pat. No. 6,667,443 which is based upon and claims the benefit of Japanese Patent Applications No. 2000-380634, filed on Dec. 14, 2000, No. 2001-195375, filed on Jun. 27, 2001, and No. 2001-333021, filed on Oct. 30, 2001, the contents of which are incorporated herein by reference.

BACKGROUND OF THE PRESENT INVENTION

1. Field of the Invention

The present invention relates to a manufacturing method of a multilayer substrate, specifically of a multilayer substrate having electrodes formed at both sides thereof.

2. Related Art

Heretofore, a manufacturing method of a multilayer substrate, which employs a so-called double-sided substrate in which conductor patterns connected with each other by interlayer connection are formed on both sides thereof, is known as a manufacturing method of a multilayer substrate having electrodes formed on both sides thereof to achieve electrical connection.

For example, a manufacturing method of a multilayer substrate is disclosed in JP-A-2000-38464. In this document, a manufacturing method of a multilayer substrate is disclosed, in which a plurality of double-sided substrates, each of which has an interlayer connection, are produced and laminated with a film insulator to which a treatment capable of an interlayer connection is carried out interposed therebetween, so that a multilayer substrate is produced that has electrodes on both sides thereof. Moreover, a manufacturing method of a multilayer substrate is disclosed, in which a double-sided substrate having an interlayer connection is produced, and single-sided conductor patterned films to which a treatment capable of an interlayer connection is carried out are laminated on both sides of the double-sided substrate, so that so that a multilayer substrate is produced that has electrodes on both sides thereof.

However, in the above-described prior art, the double-sided substrate (double-sided conductor patterned film) and the film insulator (a film without patterned conductor) are respectively formed, and combined with each other to form the multilayer substrate having the electrodes on the both sides thereof. Alternatively, the double-sided substrate (double-sided conductor patterned film) and the single-sided conductor patterned substrate are respectively formed, and combined with each other to form the multilayer substrate having the electrodes on the both sides thereof. Consequently, there is a problem in which processing steps are complicated, and production cost becomes high.

The present invention has been made in view of the above-mentioned problem, and an object thereof is to provide a manufacturing method of multilayer substrate that can be simplified and reduced in producing cost.

SUMMARY OF THE INVENTION

To achieve the object above described, according to a first aspect of the present invention, a step for laminating single-sided conductor patterned films, each of which has a resin film and a conductor pattern formed only on a single side of the resin film for forming a laminated films, and a step for removing at least a portion of a surface resin film that covers a portion of the conductor pattern to be an electrode in a single-sided conductor patterned film, at a side of the laminated films where the resin film is disposed at a surface thereof, are comprised in a manufacturing method. In this method, electrodes are formed respectively at both principal surfaces of a multilayer substrate composed of the single-sided conductor patterned films, and the electrodes are composed of conductor patterns, respectively.

According to this method, the single-sided conductor patterned films, each of which has the resin film and the conductor pattern formed only on the single side of the resin film, are laminated to form the laminated films, at least the portion of the surface resin film is removed so as to expose the electrode, and therefore the multilayer substrate with the electrodes formed at the both principal surfaces thereof can be produced. Therefore, it is unnecessary to produce the double-sided substrate in midstream of the manufacturing process, whereby it is unnecessary to provide a double-sided substrate forming process. Thus, the manufacturing process is not complicated and can be reduced in cost.

According to a second aspect of the present invention, a step for forming a resist film on a surface of the laminated films where the conductor pattern is exposed, and a step for forming a hole in the resist film at a region corresponding to a location where the electrode is to be formed are comprised in the manufacturing method.

According to this method, the surface of the laminated single-sided conductor patterned films where the conductor pattern is exposed can be covered with the resist film. Therefore, the conductor pattern can be protected except the location where the electrode is to be formed.

According to a third aspect of the present invention, the resist film is composed of the same material as the resin film.

According to this, since the resist film is composed of the same material as the resin film, the resist film is easily attached to the resin film. Therefore, the multilayer substrate with the resist film kept certainly can be obtained.

According to a fourth aspect of the present invention, the resin film is composed of a thermoplastic resin, wherein after the laminating step at which the single-sided conductor patterned films are laminated, mutual adhesion between each of the single-sided conductor patterned films is performed by applying pressure to the both principal surfaces of the substrate while heating.

According to this method, the respective single-sided conductor patterned films can adhere with each other all at once. Therefore, the manufacturing method can be simplified so that time for manufacturing can be shortened, and therefore, the manufacturing cost can be further reduced.

According to a fifth aspect of the present invention, the resin film is composed of a thermoplastic resin, wherein after the single-sided conductor patterned films are laminated and the resist is formed, mutual adhesion between each of the single-sided conductor patterned films and between the resist film and an adjoining single-sided conductor patterned film is performed by pressing both principal surfaces of the substrate while heating.

According to this method, the respective single-sided conductor patterned films and the resist film can adhere with each other all at once. Therefore, the manufacturing method can be simplified so that time for manufacturing can be shortened, and therefore, the manufacturing cost can be further reduced.

According to a six aspect of the present invention, the substrate is heated up at a temperature where an elastic modulus of the thermoplastic resin is in a range from 1 to 1000 MPa in applying pressure and heat to the multilayer substrate.

According to this method, the resin film is heated up with pressure so as to be sufficiently lowered in elastic modulus, i.e., in such a degree from 1 to 1000 MPa, so that the single-sided conductor patterned films surely adhere with each other.

According to a seventh aspect of the present invention, except a single-sided conductor patterned film having a resin film constituting the principal surface of the multilayer substrate, each single-sided conductor patterned film has a via hole through which the conductor pattern as a bottom face is exposed and, which is filled with a conductive paste so that respective conductor patterns of adjacent single-sided conductor patterned films are electrically connected with each other.

According to this method, an interlayer electrical connection between each of the conductor patterns in the multilayer substrate can be secured by the conductive paste in the via hole.

According to a eighth aspect of the present invention, a step for laminating single-sided conductor patterned films, each of which has a resin film, a conductor pattern formed only on a single side of the resin film and a via hole that is formed at a predetermined location and filled with an interlayer connection material, wherein an exposed conductor pattern of the single-sided conductor patterned film, which is located on a first surface of a laminated single-sided conductor patterned films, is formed as a first conductive foil that covers a resin film of the single-sided conductor patterned film entirely, a step for forming a second conductive foil on a surface resin film which constitutes a second surface of the laminated single-sided conductor patterned films, so as to cover the surface resin film entirely, and a step for patterning the conductive foils disposed on both sides of the laminated single-sided conductor patterned films so as to form first and second conductor patterns, are comprised in a manufacturing method. In this method, electrodes are formed by the first and second conductor patterns on the first and second surfaces of a multilayer substrate which is formed by laminating the single-sided conductor patterned films.

According to this method, the single-sided conductor patterned films, each of which has the resin film, the conductor pattern formed only on the single side of the resin film and the via hole that is formed at the predetermined location and filled with an interlayer connection material, are laminated, and the first and second conductive foils covers the both sides disposed at an outermost of the laminated single-sided conductor patterned films, the conductive foils are patterned, whereby the multilayer substrate with the electrodes at the both sides thereof can be produced. Therefore, it is unnecessary to produce a substrate with conductor patterns on both sides thereof in midstream of a manufacturing process. Thus, the manufacturing process is not complicated and can be reduced in cost.

According to a ninth aspect of the present invention, resist films are formed on the shaped conductor patterns at the both sides of the multilayer substrate, the resist films are composed of the same material as the resin film.

According to this, since the resist films are composed of the same material as the resin film formed on the single-sided conductor patterned film, the resist films easily adhere to the resin film. Therefore, the multilayer substrate with the resist films kept certainly can be obtained.

Incidentally, as described in a tenth aspect of the present invention, the first and second conductive foils may be patterned so that only lands remain as electrodes. In this case, since wiring patterns are not formed on the both sides of the multilayer substrate, it is unnecessary to form resist films to protect and insulate the wiring patterns. Thus, the manufacturing process can be further simplified.

According to an eleventh aspect of the present invention, the resin film is composed of a thermoplastic resin, after the conductive foils are formed on the both sides of the multilayer substrate, the respective single-sided conductor patterned films adhere with each other by pressing the multilayer substrate from its both surfaces while heating.

According to this method, the respective single-sided conductor patterned films can be mutually adhered all at once. Therefore, the manufacturing method can be simplified so that time for manufacturing can be shortened, and therefore, the manufacturing cost can be further reduced.

According to a twelfth aspect of the present invention, the, multilayer substrate is heated up at a temperature where an elastic modulus of the thermoplastic resin is in a range from 1 to 1000 MPa in applying pressure and heat to the multilayer substrate.

According to this method, the resin film is heated up while applying pressure so as to be sufficiently lowered in elastic modulus, i.e., in such a degree from 1 to 1000 MPa, so that the single-sided conductor patterned films are surely adhered with each other.

According to thirteenth aspect of the present invention, the interlayer connection material is a conductive paste, and said via hole has a bottom constituted by the conductor pattern, so that respective conductor patterns of adjacent single-sided conductor patterned films are electrically connected with each other through the conductive paste.

According to this method, an interlayer electrical connection between each of the conductor patterns in the multilayer substrate can be secured by the conductive paste in the via hole.

According to a fourteenth aspect of the present invention, a manufacturing method of multilayer substrate comprises laminating single-sided conductor patterned films, each of which has a resin film, a conductor pattern formed only on a single side of the resin film and a via hole which is formed at a predetermined location and filled with an interlayer connection material, and adhering the single-sided conductor patterned films to each other to form a multilayer substrate, wherein an arbitrary two of single-sided conductor patterned films are laminated so that surfaces thereof on which the conductor patterns are not formed face with each other, while remaining single-sided conductor patterned films are laminated in such a manner that a surface on which the conductor pattern is formed and a surface on which the conductor pattern is not formed face with each other, whereby electrode are formed by the conductive patterns at both sides of the multilayer substrate.

According to this method, when the single-sided conductor patterned films, each of which has a resin film, a conductor pattern formed only on a single side of the resin film and a via hole that is filled with an interlayer connection material, are laminated, only at one portion in the laminated single-sided conductor patterned films, adjoining single-sided conductor patterned films are laminated so that surfaces thereof on which the conductor patterns are not formed face with each other to thereby dispose the conductor patterns so as to face outsides, while the single-sided conductor patterned films in the remaining single-sided conductor patterned films are laminated in a same direction with respect to an adjoining single-sided conductor patterned films, i.e., are laminated so that the conductor patterns face outwardly. As a result, the multilayer substrate with electrodes formed at the both sides thereof can be produced.

Therefore, it is unnecessary to produce the double-sided substrate in midstream of the manufacturing process. Thus, the manufacturing process is not complicated and can be reduced in cost.

According to a fifteenth aspect of the present invention, resin films are formed on conductor patterns disposed on both sides of the multilayer substrate, the resist films are composed of the same material as the resin film.

According to this, since the resist films are composed of the same material as the resin film formed on the single-sided conductor patterned film, the resist films easily adhere to the resin film. Therefore, the multilayer substrate with the resist films kept certainly can be obtained.

Incidentally, as described in a sixteenth aspect of the present invention, the conductor patterns, formed on the both sides of the multilayer substrate, can be only formed by lands to be electrodes. In this case, since wiring patterns are not formed on the both sides of the multilayer substrate, it is unnecessary to form resist films to protect and insulate the wiring patterns. Thus, the manufacturing process can be further simplified.

According to a seventeenth aspect of the present invention, the resin film is composed of a thermoplastic resin, after the conductor patterns exposed at the both sides of the multilayer substrate are formed as conductive foils, respectively, which cover the resin films entirely, the respective single-sided conductor patterned films adhere with each other by pressing the multilayer substrate from its both surfaces while heating. After this, the electrodes are formed by patterning the conductive foils.

According to this method, the respective single-sided conductor patterned films can adhere with each other all at once. Moreover, this method improves mold release characteristic caused between the multilayer substrate and a press apparatus to apply the pressure.

According to eighteenth aspect of the present invention, the resin film is composed of a thermoplastic resin, after conductor patterns disposed on all of single-sided conductor patterned films are patterned into predetermined shapes, the single-sided conductor patterned films are adhered with each other by applying pressure the multilayer substrate from its both sides while heating.

According to this, the respective single-sided conductor patterned films can adhere with each other all at once. Moreover, it is unnecessary to conduct the patterning step after the attaching step. Therefore, the manufacturing method can be simplified, time for manufacturing can be shortened, and therefore, the manufacturing cost can be further reduced.

According to a nineteenth aspect of the present invention, the substrate is heated up at a temperature where an elastic modulus of the thermoplastic resin is in a range from 1 to 1000 MPa in applying pressure and heat to the multilayer substrate.

According to this method, the resin film is heated up while applying pressure so as to be sufficiently lowered in elastic modulus, i.e., in such a degree from 1 to 1000 MPa, in the pressing step, so that the single-sided conductor patterned films surely adhere with each other.

According to a twentieth aspect of the present invention, the interlayer connection material is a conductive paste, and each single-sided conductor patterned film has a via hole through which the conductor pattern as a bottom face is exposed and, which is filled with the conductive paste so that respective conductor patterns of adjacent single-sided conductor patterned films are electrically connected with each other through the conductive paste.

According to this method, an interlayer electrical connection between each of the conductor patterns in the multilayer substrate can be secured by the conductive paste in the via hole.

Incidentally, twenty-first to twenty-fourth aspects of the present invention resolve the problem described below.

Heretofore, via holes formed in general multilayer substrate approximately have a circular shape in identical diameter. When the multilayer substrate is formed by pressing a laminated resin films (isolation base material) while heating, if interlayer connection materials, which are disposed in a pair of via holes respectively formed in an adjoining two of the resin films, directly connected with each other without land portions or the like interposed therebetween, there can be a case where centers of each of the pair of via holes are displaced with each other by fluctuation in location of each of the resin films in laminating and pressing while heating.

In this case, when each of the pair of the via holes has a circular shape, there can be a case where a cross sectional area of the interlayer connection material filled in the via hole in a connecting point of the pair of via holes. In this case, such a problem occurs that resistance of interlayer connection increases.

To solve the above-mentioned problem, according to the twenty-first aspect of the present invention, via holes of the single-sided conductor patterned films that are laminated so that surfaces thereof on which the conductor patterns are not formed face with each other, are formed approximately in an elliptical shape, and said elliptical-shaped via holes are overlapped with each other so that long axes thereof are disposed in orthogonal to one another.

Moreover, according to the twenty-second aspect of the present invention, via holes of the single-sided conductor patterned films that are laminated so that surfaces thereof on which the conductor patterns are not formed face with each other, are formed in a radial shape having three or more liner portions which radially extend from a center portion, and the radial-shaped via holes are overlapped with each other.

According to these, even if centers of the via holes, disposed in the two of the single-sided conductor patterned films that are laminated so that surfaces thereof on which the conductor patterns are not formed face with each other, are slightly displaced from each other, the interlayer connection material can secure a predetermined cross sectional area thereof at the connecting point of the via holes. Therefore, the resistance of interlayer connection can be prevented from increasing.

Moreover, according to a twenty-third aspect of the present invention, the radial-shaped via holes in the twenty-second aspect may, concretely, have a crisscross pattern composed of four liner portions.

According to a twenty-fourth aspect of the present invention, via holes respectively formed in said predetermined number of single-sided conductor patterned films have an approximate circular shape. The via holes of single-sided conductor patterned films that are laminated so that surfaces thereof on which the conductor patterns are not formed face with each other, have a diameter larger than that of the via holes formed in said remaining single-sided conductor patterned films. Moreover, the via holes are overlapped with each other when the arbitrary two of the predetermined number of single-sided conductor patterned films are laminated.

Also by this method, even if centers of the via holes, disposed in the two of the single-sided conductor patterned films that are laminated so that surfaces thereof on which the conductor patterns are not formed face with each other, are slightly displaced with each other, the interlayer connection material can secure a predetermined cross sectional area thereof at the connecting point of the via holes. Therefore, the resistance of interlayer connection can be prevented from increasing.

Further, an each multilayer substrate respectively described in twenty-fifth to twenty-seventh aspects of the present invention can be produced by the method respectively described in the fourteenth and sixteenth to twentieth aspects of the present invention.

Moreover, a multilayer substrate described in a twenty-eighth aspect of the present invention can be produced the method described in the twenty-first aspect of the present invention. A multilayer substrate described in a twenty-ninth aspect of the present invention can be produced the method described in the twenty-second aspect of the present invention.

Further, according to a thirtieth aspect of the present invention, the radial-shaped via holes in the twenty-ninth aspect may, concretely, have a crisscross pattern composed of four liner portions.

Moreover, a multilayer substrate described in a thirty-first aspect of the present invention can be produced the method described in the twenty-fourth aspect of the present invention.

Other objects and features of the present invention will become more readily apparent from a better understanding of the preferred embodiment described below with reference to the following drawings.

DETAILED DESCRIPTION OF THE PREFERRED EMBODIMENT

[First Embodiment]

Hereinafter, an embodiment will be explained with reference to figures. FIGS. 1A to 1E show a respective manufacturing step of a multilayer substrate in this embodiment.

Figure 1A:
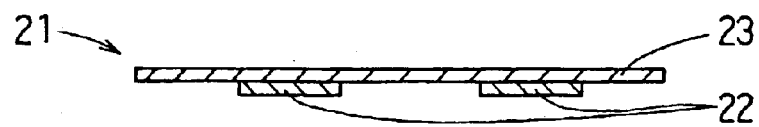
FIGS. 1A to 1E are cross sectional views in respective processes showing schematic manufacturing method of a multilayer substrate in the first embodiment of the present invention.

In FIG. 1A, 21 denotes a single-sided conductor patterned film which has a conductor pattern 22 patterned by etching a conductor foil (copper foil having a thickness of 18 $\mu$m in this embodiment) attached on a single side of a resin film 23 as an insulated base. In this embodiment, as the resin film 23, a resin film having a thickness of 25 to 75 $\mu$m is employed, which is composed of a polyetheretherketone resin at 65 to 35 wt % and a polyetherimide resin at 35 to 65 wt %. Moreover, other metal foil such as aluminum foil or the like can be employed as the conductive foil.

Figure 1B:
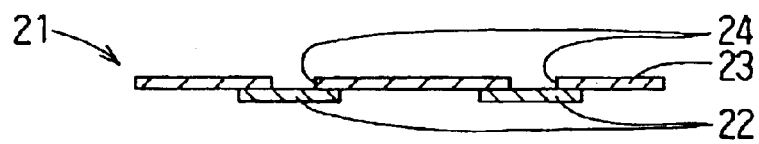

As shown in FIG. 1, a formation of conductor patterns 22 is finished, then, via holes 24 are formed by irradiating a carbon dioxide gas laser from a side of the resin film 23 so that bottom equipped via holes are provided to have bottom constructed by the conductor pattern 22 as shown in FIG. 1B. In the formation of via holes, a power and radiating time or the like of the carbon dioxide gas laser is regulated so that hole is not formed in the conductor pattern 22. An excimer laser or the like can be employed for the formation of via hole except the carbon dioxide gas laser. Although a formation of via hole with drill process or the like other than the laser can be employed, it is proper to form a hole with the laser since the hole is formed to have a minute diameter and the conductor pattern is restrained from being damaged.

Figure 1C:
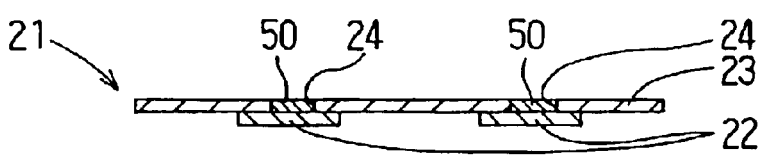

As shown in FIG. 1B, the formation of via holes 24 is finished, then, the via holes are filled with a conductive paste 50 as an interlayer connection material as shown in FIG. 1C. The conductive paste 50 is a paste formed by combining metal particles such as copper, silver, tin or the like and a binder resin or an organic resolvent and mixing up them.

The via holes 24 are filled with the conductive paste 50 so that the conductive paste 50 is printed to the via holes 24 using a screen printing apparatus with a metal mask while the conductor patterns 22 of the single-sided conductor pattern film 21 are disposed as a lower side. This arrangement is made for the purpose of preventing the conductive paste 50 filled in via holes 24 from falling. When the conductive paste 50 is a type that does not fall, the single-sided conductor patterned film 21 can be oriented toward directions except a direction in which a side of the conductor pattern 22 is disposed on the lower side. Moreover, although the via holes 24 are filled with the conductive paste 50 by using the screen printing in this embodiment, if filling is secured, other way using a dispenser or the like can be employed.

Filling via holes 24 with conductive paste 50 is finished, then, a plurality (three in this embodiment) of single-sided conductor patterned films 21 are laminated so that each of the sides where the conductor pattern 22 is arranged is disposed at the lower side while a single-sided conductor patterned film 31 without via hole is laminated on a upper side of the plurality of single-sided conductor patterned films 21 so that a side where a conductor pattern 21 is arranged is disposed at the lower side.

Here, openings 33 are formed in the single-sided conductor patterned film 31 so as to expose electrodes 32 by the same way as the formation of via hole 24 that is shown in FIG. 1B, so that a resin film 23 is removed at locations corresponding to regions of conductor patterns 22 that are to become electrodes.

Moreover, a cover layer 36 as a resist film is disposed at a lower side of a laminated plurality of single-sided conductor patterned films 21 so as to cover a conductor pattern disposed on a bottom layer. Similarly, openings 38 are formed in the cover layer 36 so as to expose electrodes 37, which are disposed at locations corresponding to regions of conductor patterns 22 in the bottom layer that are to become electrodes. In this embodiment, as the cover layer 36, a resin film is employed that is composed of the polyetheretherketone resin at 65 to 35 wt % and a polyetherimide resin at 35 to 65 wt % that is identical to the resin film 23.

Figure 1D:
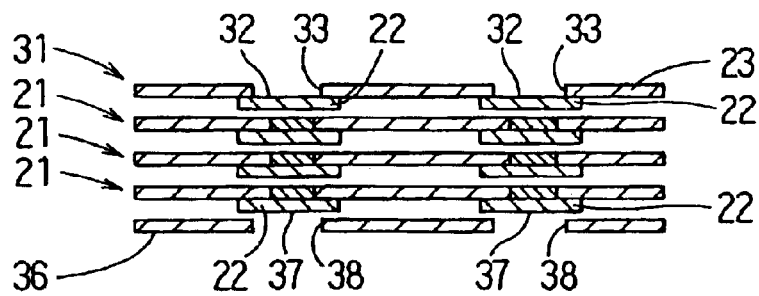

As shown in FIG. 1D, after the single-sided conductor patterned films 21 and 31, and the cover layer 36 are laminated, then pressure is applied to both upper and lower sides of them by a vacuum heating-up press apparatus while heating. In this embodiment, a temperature is set at between 200 and 350° C. and the pressure is set at between 0.1 and 10 MPa.

Figure 1E:
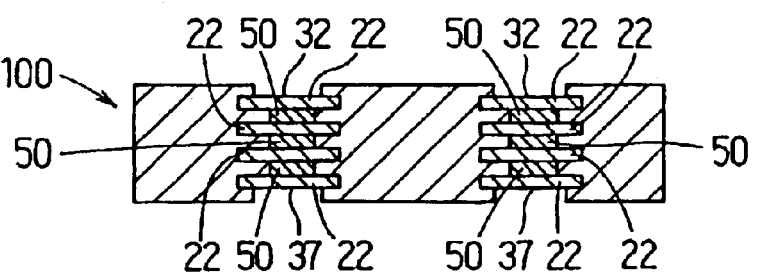

Thus, as shown in FIG. 1E, each of the single-sided conductor patterned films 21, the single-sided conductor patterned film 31 and the cover layer 36 adhere with each other. Heat sealing occurs in the resin films 23 and cover layer 36 to unify with each other, and interlayer connections are achieved between adjoining conductor patterns 22 through the conductive paste 50, so that a multilayer substrate 100 is obtained so as to have the electrodes 32 and 37 at both sides thereof. The resin films 23 and the cover layer 36 are surely unified with each other when pressed and softened with heat since the resin films 23 and the cover layer 36 are composed of the same thermoplastic resin material.

The resin films 23 and cover layer 36 are composed of the same thermoplastic resin material, and when they are pressed and heated up by the vacuum heating-up press apparatus, elastic modulus of the resin films 23 and cover layer 36 is lowered approximately to 5 to 40 MPa. Therefore, each of the resin film and the like surely adhere with each other.

Incidentally, the elastic modulus of the resin films 23 and cover layer 36 is at from 1 to 1000 MPa preferably in pressing while heating. When the elastic modulus is higher than 1000 MPa, it is hard to cause the heat sealing between the resin films 23, and a problem of breaking of wire or the like is apt to occur by applying large stress to the conductor patterns 22 by pressing. Meanwhile, when the elastic modulus is lower than 1 MPa, the resin film or the like is easily displaced to cause displacement of the conductor pattern 22, and therefore it is hard to form the multilayer substrate 100.

According to the above-mentioned manufacturing method of the multilayer substrate, the single-sided conductor patterned films 21, each of which has the conductor pattern 22 formed on the one side thereof, and the single-sided conductor patterned films 31 having the conductor pattern 22 formed on the one side thereof and the resin film to which a opening-formation removal process is performed are laminated. Moreover, the cover layer 36 to which an opening-formation removal process is performed is laminated on a side of the laminated single-sided conductor patterned films 21 where the conductor pattern 22 is exposed so that the electrodes 37 are exposed. Then, the laminated structure is pressed while heating, thereby producing the multilayer substrate having electrodes at the both sides thereof.

Therefore, the multilayer substrate 100 is formed by only the single-sided conductor patterned films 21 and 31, and the cover layer 36, so that it is unnecessary to form a double-sided substrate in midstream of the manufacturing process, whereby it is unnecessary to provide a double-sided substrate forming process. Thus, the manufacturing process is not complicated and can be reduced in cost.

Moreover, mutual adhesions between each of the single-sided conductor patterned films 21, 31 and the cover layer 36 can be performed all at once by one time of the pressing while heating. Therefore, the manufacturing method can be simplified so that time for manufacturing can be shortened, and therefore, the manufacturing cost can be further reduced.

[Second Embodiment]

Next, a second embodiment will be explained with reference to figures.

In the second embodiment, formations of conductor patterns including electrodes 32 and 37 are performed after multi-layered with respect to the first embodiment. Incidentally, the same component parts as the first embodiment are designated by the same reference numerals to omit explanation thereof.

Figure 2A:
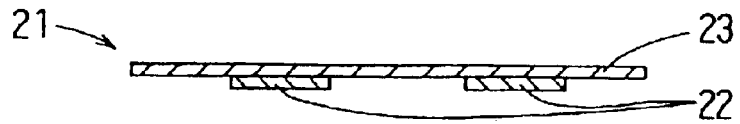
FIGS. 2A to 2H are cross sectional views in respective processes showing schematic manufacturing method of a multilayer substrate in the second embodiment of the present invention.
Figure 2B:
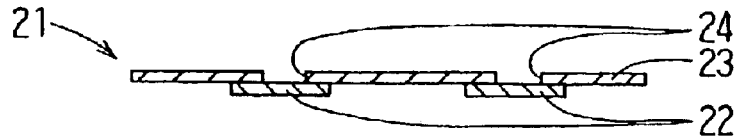
Figure 2C:
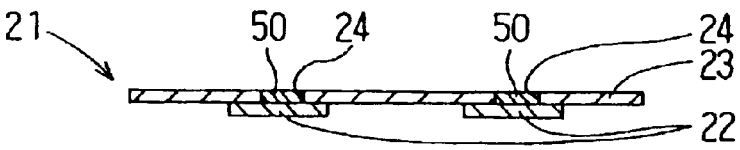

A formation of conductor 22, a formation of via hole 24, and filling with conductive paste 50 shown in FIGS. 2A to 2C are the same manufacturing process as the first embodiment shown in FIGS. 1A to 1C.

Figure 2D:
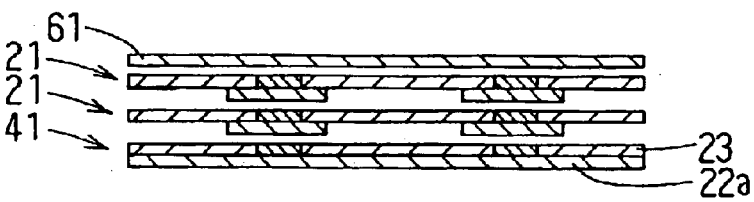

Filling via holes 24 with conductive materials 50 is finished, then, a plurality (two in this embodiment) of single-sided conductor patterned films 21 are laminated so that each side thereof where a conductor pattern 22 is arranged is disposed at a lower side, and a copper foil 61 (a thickness of 18 μm in this embodiment) as a conductor foil is laminated on an upper side of them as shown in FIG. 2D.

Moreover, a single-sided conductor patterned film 41 is laminated on a lower side of the laminated single-sided conductor patterned films 21, in which the formation of via hole 24 shown in FIG. 2B and the filling with conductive paste 50 shown in FIG. 2C are carried out to a single-sided conductor patterned film having a copper foil 22a attached thereto as a conductor foil that has a shape before a pattern formation is performed, i.e., is disposed without forming of a conductor pattern 22 shown in FIG. 2A.

As shown in FIG. 2D, the copper foil 61, the single-sided conductor patterned films 21 and single-sided conductor patterned film 41 are laminated, then, they are pressed from both upper and lower sides thereof while heating by a vacuum heating-up press apparatus.

Figure 2E:
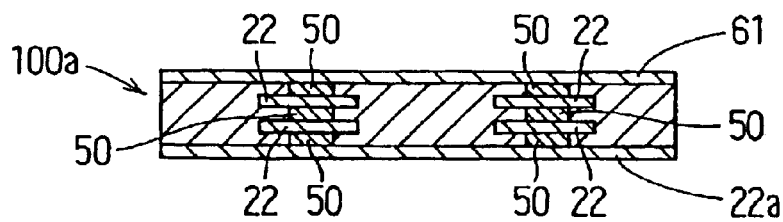

Thus, as shown in FIG. 2E, each of the single-sided conductor patterned films 21, the single-sided conductor patterned film 41, and the copper foil 61 adhere with each other. Heat sealing occurs in the resin films 23 to unify with each other, and interlayer connections are achieved between adjoining conductor patterns 22, the copper foils 22a and 61 through the conductive pastes 50, so that a multilayer substrate 100a is obtained which is covered with the copper foils 22a, 61 at both sides thereof, respectively.

Figure 2F:
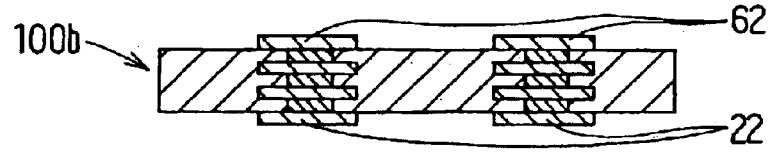
Figure 2G:
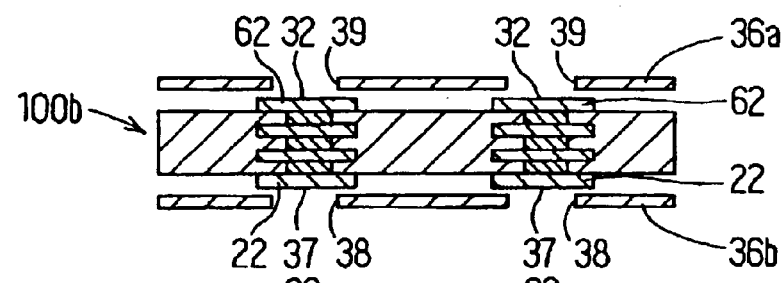

After the multilayer substrate 100a is obtained, patterning is performed to the copper foils 22a and 61. As shown in FIG. 2F, conductor patterns 22 and 62 are formed at outermost layers of the multilayer substrate 100a by patterning, whereby a multilayer substrate 100b appears. Next, a cover layer 36a as a resist film is laminated so as to cover the conductor pattern 62 disposed at a top layer of the multilayer substrate 100b, and a cover layer 36b as a resist film is laminated so as to cover the conductor pattern 22 disposed at a bottom layer of the multilayer substrate 100b.

Openings 39 are formed at regions in the cover layer 36a so as to expose electrodes 32, which correspond to locations of the conductor pattern 62 at the top layer that are to be electrodes, while openings 38 are formed at region in the cover layer 36b so as to expose electrodes 37, which correspond to locations of the conductor pattern 22 at the bottom layer that are to be electrodes. In this embodiment, as the cover layers 36a and 36b, resin films are employed that are composed of the polyetheretherketone resin at 65 to 35 wt % and a polyetherimide resin at 35 to 65 wt % and are identical to the resin film 23.

Figure 2H:
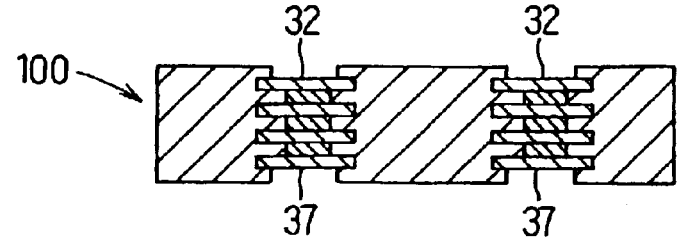

After the cover layers 36a and 36b are laminated, then the laminated structure are pressed from both upper and lower sides thereof while heating by a vacuum heating-up press apparatus. Thus, as shown in FIG. 2H, the cover layers 36a and 36b are attached to the multilayer substrate 100b, thereby obtaining a multilayer substrate 100 having the electrodes 32 and 37 at both sides thereof. The resin films 23 and the cover layers 36a and 36b are surely unified with each other when pressed and softened with heat since the resin films 23 and the cover layer 36 are composed of the same thermoplastic resin material.

The resin films 23 and cover layers 36a and 36b are composed of the same thermoplastic resin material, and when they are pressed and heated up by the vacuum heating-up press apparatus, elastic modulus of the resin films 23 and cover layers 36a and 36b is lowered approximately to 5 to 40 MPa. Therefore, each of the resin film 23 and the like surely adhere with each other.

Incidentally, the elastic modulus of the resin films 23 and cover layers 36a and 36b is at from 1 to 1000 MPa preferably in pressing while heating. When the elastic modulus is higher than 1000 MPa, it is hard to cause the heat sealing between each of the resin films 23 and the like, and a problem of breaking of wire or the like is apt to occur by applying large stress to the conductor patterns 22 by pressing. Meanwhile, when the elastic modulus is lower than 1 MPa, the resin film or the like is easily displaced to cause displacement of the conductor pattern 22, and therefore it is hard to form the multilayer substrate 100.

According to the above-mentioned manufacturing method of the multilayer substrate, the multilayer substrate 100 is composed only of the single-sided conductor patterned films 21 and 41, the copper foil 61 and the cover layers 36a and 36b to have the electrodes 32 and 37 at the both sides thereof. Therefore, it is unnecessary to form a double-sided substrate in midstream of the manufacturing process. Thus, the manufacturing process of the multilayer substrate is not complicated and can be reduced in cost.

Moreover, adhesions of each of the single-sided conductor patterned films 21 and 41, and the copper foil 61 can be performed all at once by one time of the pressing while heating. Therefore, the manufacturing method can be simplified so that time for manufacturing can be shortened, and therefore, the manufacturing cost can be further reduced. Incidentally, processing conditions such as the pressing while heating and materials of each part in this embodiment are the same as the first embodiment.

Moreover, in the second embodiment, after the patterning by etching is conducted to the copper foils 22a and 61, the cover layers 36a and 36b as the resist films are laminated so as to cover the conductor patterns 22 and 62 at the outermost layers. When the conductor patterns 22 and 62 at the outermost layers have wiring patterns connected to lands to be electrodes 32 and 37 in addition to the lands, as described above, the cover layers 36a and 36b should be laminated on the conductor patterns 22 and 62 to insulate and protect the wiring patterns.

However, when the conductor patterns 22, 62 are formed so as only to have the lands to be electrodes 32 and 37, and the wiring patterns connected to the electrodes 32 and 37 are constructed by the conductor patterns 22 in lower layers, the cover layers 36a and 36b may not be laminated on the conductor patterns 22 and 62. In this case, as shown in FIG. 2F, the multilayer substrate 100 is completed at a time when the patterning by etching is conducted to the copper foils 22a and 61. Therefore, the following steps for laminating the cover layers 36a and 36b, and for pressing and heating to adhere the cover layers 36a and 36b can be omitted, so that the manufacturing process can be further simplified. Moreover, since the pressing and heating only can be conducted through the copper foils 22a and 61 by the heating-up press apparatus, there is no need to use a release sheet for preventing adhesion between the resin films 23 and the heating-up press apparatus. Incidentally, the release sheet is composed of material having a low adhesion characteristic with respect to even the resin film 23 in which the elastic modulus is lowered by heating, for example, polyimide or Teflon (registered trademark) or the like.

[Third Embodiment]

Next, a third embodiment will be explained with reference to figures.

In the third embodiment, a lamination direction of single-sided conductor patterned films is opposite to the first embodiment at a part of the single-sided conductor patterned films. Incidentally, the same component parts as the first embodiment are designated by the same reference numerals to omit explanation thereof.

Figure 3A:
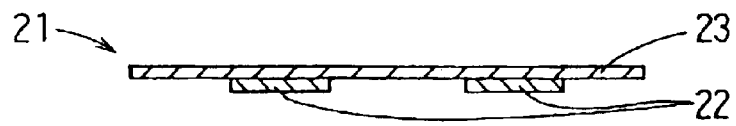
FIGS. 3A to 3E are cross sectional views in respective processes showing schematic manufacturing method of a multilayer substrate in the third embodiment of the present invention.
Figure 3B:
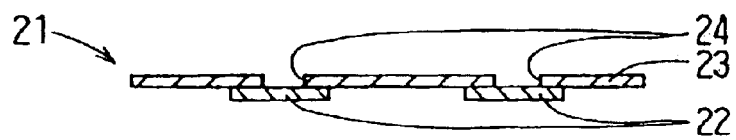
Figure 3C:
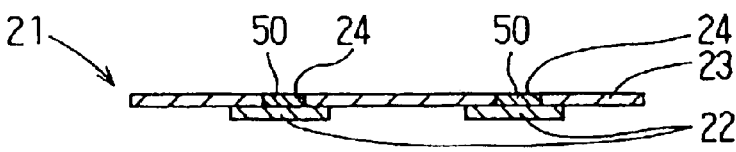

A formation of conductor 22, a formation of via hole 24, and filling with conductive paste 50 shown in FIGS. 3A to 3C are the same manufacturing process as the first embodiment shown in FIGS. 1A to 1C.

Figure 3D:
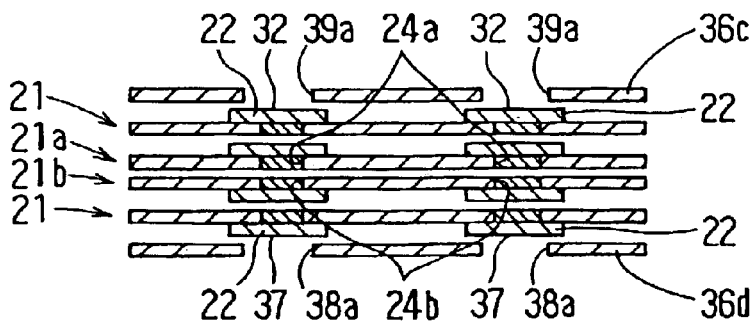

Filling via holes 24 with conductive materials 50 is finished, then, a plurality (four in this embodiment) of single-sided conductor patterned films 21, 21a, and 21b are laminated. At that time, lower two of the single-sided conductor patterned films 21, 21b are laminated so that each side thereof where a conductor pattern 22 is arranged is disposed at a lower side, while upper two of the single-sided conductor patterned films 21, 21a are laminated so that each side thereof where a conductor pattern 22 is arranged is disposed at an upper side as shown in FIG. 3D.

Namely, two of the single-sided conductor patterned films 21a, 21b located at a center in the laminated single-sided conductor patterned films are laminated so that respective surfaces thereof on which the conductor pattern 22 is not formed face with each other, while remaining two of the single-sided conductor patterned films 21 are laminated so that a surface on which the conductor pattern 22 is not formed and a surface on which the conductor pattern 22 is formed face with each other.

Here, the single-sided conductor patterned films 21a, 21b, located at the center and laminated so that the respective surfaces thereof on which the conductor pattern 22 is not formed face with each other, are formed, similarly to the single-sided conductor patterned films 21, through the formation of conductor pattern, formation of via hole and filling with conductive paste as shown in FIGS. 3A to 3C.

Figure 4A:
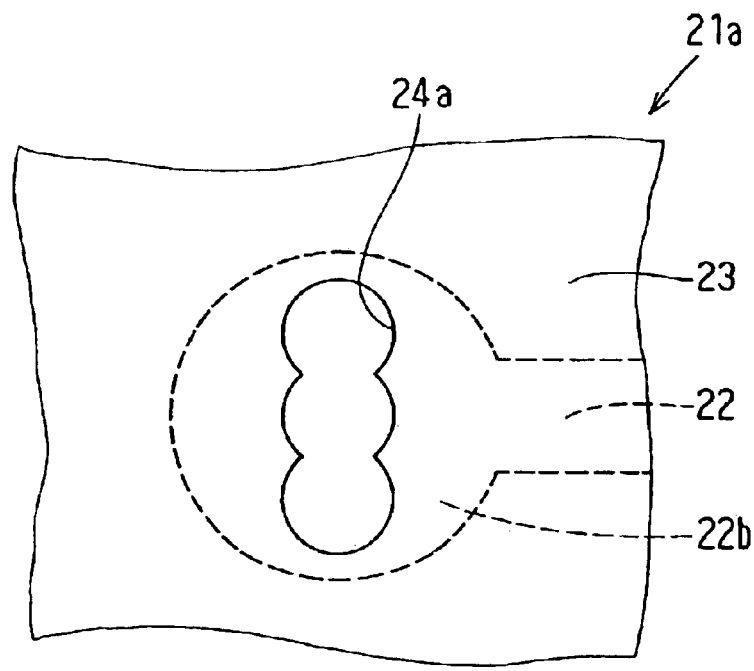
FIGS. 4A and 4B are plan views showing essential portions of the single-sided conductor patterned films in the third embodiment of the present invention.
Figure 4B:
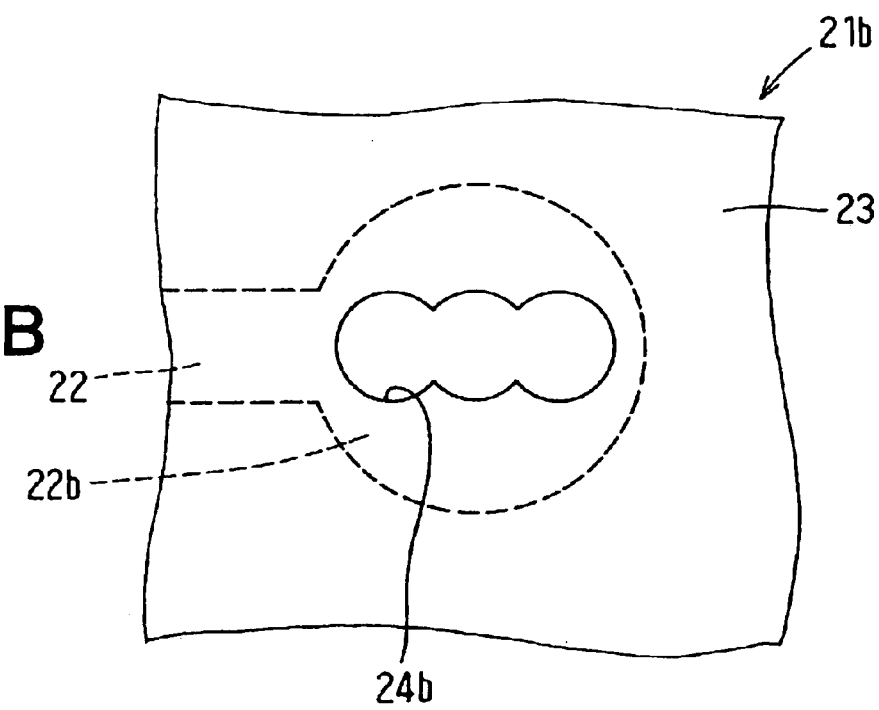

However, via holes 24a, 24b formed in the single-sided conductor patterned films 21a and 21b are formed in an approximately oblong circular shape as shown in FIGS. 4A and 4B, by radiating several times while laser beam is shifted. In this embodiment, the via holes 24a and 24b have a length of approximately 250 μm, a width of approximately 100 μm with respect to land portions 22b of the conductor patterns 22 having a diameter of approximately 300 μm. Incidentally, FIGS. 4A and 4B are the figures showing via hole forming portions of the single-sided conductor patterned films 21a and 21b that are seen from sides where the resin films 23 are formed.

Incidentally, the via hole 24 formed in the single-sided conductor patterned film 21 has a circular shape having a length of approximately 70 μm.

As described above, preferably, length of the via holes 24a and 24b is slightly short in comparison with the diameter of the land portions 22b. This dimension is made for the purpose of surely forming bottom equipped via holes in consideration of an alignment accuracy of openings of the via holes 24a and 24b. However, if there is no possibility that the conductive pastes 50 in the via holes 24a and 24b leak out from the via holes 24a and 24b, the length of the via holes 24a and 24b may be set to equal or more to the length of the land portions 22b.

Moreover, width of the via holes 24a and 24b is preferably as narrow as possible in such a degree that a predetermined connection area, which is described later, can be secured when the via holes 24a and 24b are overlapped with each other. This design is made for the purpose of securing adhesion area between the land portion 22b of the conductor pattern 22 and the resin film 23.

Figure 5A:
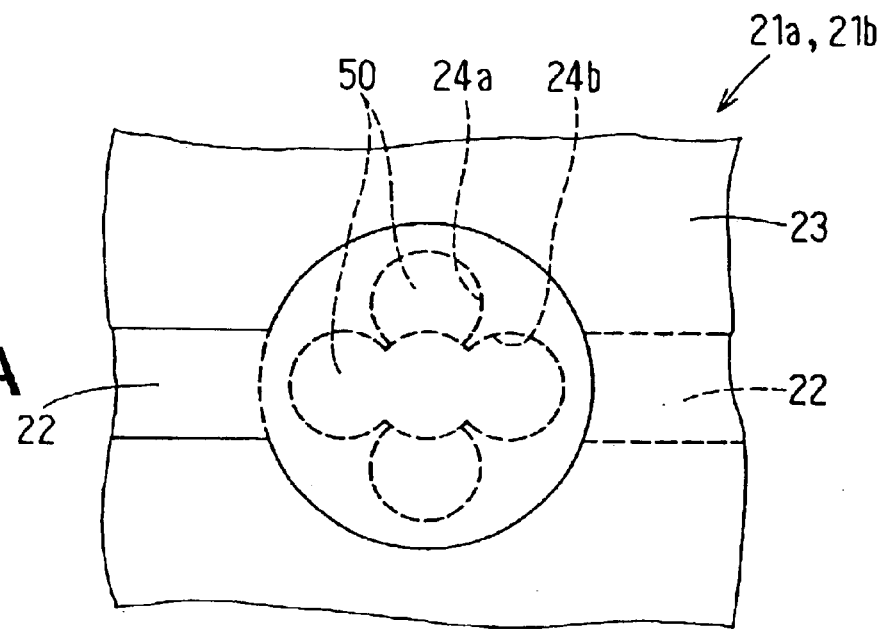
FIGS. 5A and 5B are plan views showing essential portions of the single-sided conductor patterned films and laminated condition thereof in the third embodiment of the present invention.

Then, when the single-sided conductor patterned films 21, 21a, and 21b are laminated as shown in FIG. 3D, the single-sided conductor patterned films 21a and 21b are overlapped with each other so that long axes of the via holes 24a and 24b as a facing pair of via holes are disposed in orthogonal to one another as shown in FIG. 5A. Incidentally, FIG. 5A is a figure showing a via connection between the single-sided conductor patterned films 21a and 21b that is seen from an upside.

Figure 5B:
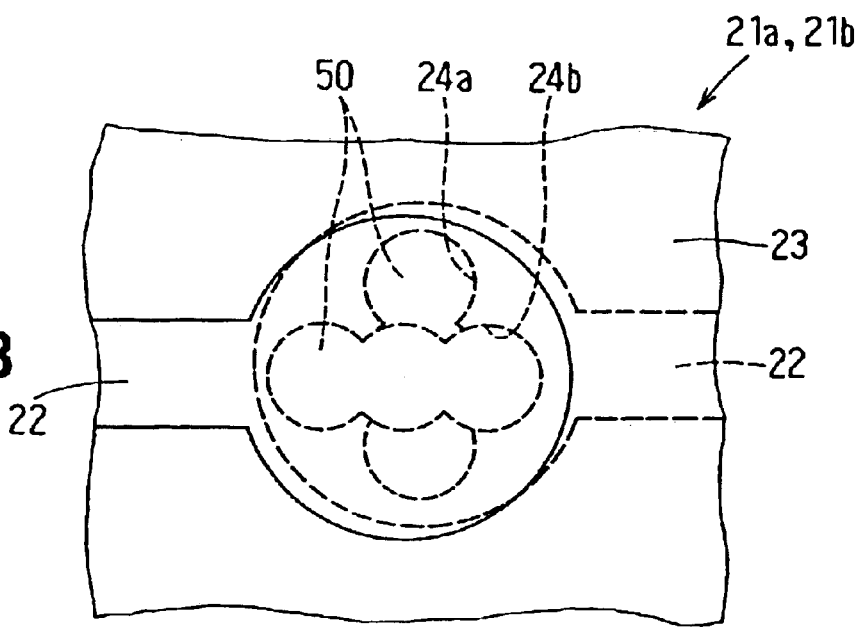

Thus, when overlapped so that the long axes are disposed in orthogonal to one another, even if relative position between the single-sided conductor patterned films 21a and 21b in laminating is slightly displaced as shown in FIG. 5B, the connection area formed by the conductive material 50 filled in the via hole 24a and the conductive material 50 filled in the via hole 24b is set at approximately equal to that in a case when the displacement does not occur. Therefore, an interlayer connection resistance due to the displacement is prevented form increasing.

Preferably, the connection area formed by the conductive material 50 filled in the via hole 24a and the conductive material 50 filled in the via hole 24b is approximately twice as large as a cross sectional area of the conductive paste 50 in the via hole 24 disposed in the other interlayer. This design is made for the reason as follows. That is, a sum of depths of the via holes 24a and 24b becomes twice as large as a depth of the via hole 24 in the other layer, and therefore, it is possible to approximately equalize each of the interlayer connection resistances by setting the connection area as described above.

As shown in FIG. 3D, a cover layer 36c as a resist film is laminated on the laminated single-sided conductor patterned films 21, 21a and 21b at an upper side thereof so as to cover the conductor pattern 22 disposed at a top layer, while a cover layer 36d as the resist film is laminated on the laminated single-sided conductor patterned films 21, 21a and 21b at a lower side thereof so as to cover the conductor pattern 22 disposed at a bottom layer.

Openings 39a are formed at region in the cover layer 36c so as to expose electrodes 32, which correspond to locations of the conductor pattern 22 at the top layer that are to be electrodes, while openings 38a are formed at region in the cover layer 36d so as to expose electrodes 37, which correspond to locations of the conductor pattern 22 at the bottom layer that are to be electrodes. In this embodiment, as the cover layers 36c and 36d, resin films are employed that are composed of the polyetheretherketone resin at 65 to 35 wt % and a polyetherimide resin at 35 to 65 wt % and are identical to the resin film 23.

After the single-sided conductor pattern films 21, 21a, and 21b, and the cover layers 36c and 36d are laminated, then they are pressed while heating from both upper and lower sides thereof by a vacuum heating-up press apparatus.

Figure 3E:
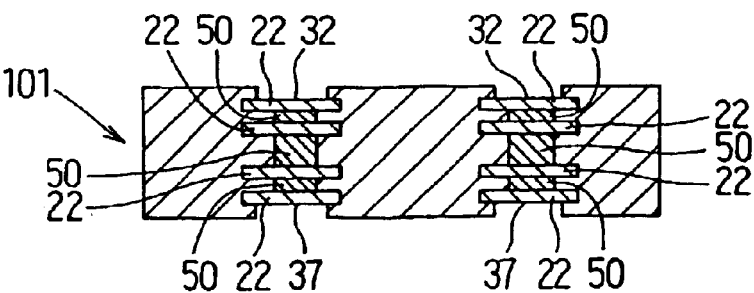

Thus, as shown in FIG. 3E, the single-sided conductor pattern films 21, 21a, and 21b, and the cover layers 36c and 36d are attached with each other. The resin films 23 and the cover layers 36c and 36d are surely unified with each other by thermal fusion bond, and interlayer connection is achieved between an adjoining conductor patterns 22 through the conductive paste 50 in the via hole 24, 24a or 24b, thereby obtaining a multilayer substrate 101 having the electrodes 32 and 37 at both sides thereof. The resin films 23 and cover layers 36c and 36d are composed of the same thermoplastic resin material, and are softened by heating and pressing thereby being surely unified.

The resin films 23 and cover layers 36c and 36d are composed of the same thermoplastic resin material, and when they are pressed and heated up by the vacuum heating-up press apparatus, elastic modulus of the resin films 23 and cover layers 36c and 36d is lowered approximately to 5 to 40 MPa. Therefore, each of the resin film 23 and the like are surely attached with each other.

Incidentally, the elastic modulus of the resin films 23 and cover layers 36c and 36d is at from 1 to 1000 MPa preferably in pressing while heating. When the elastic modulus is higher than 1000 MPa, it is hard to cause the heat sealing between each of the resin films 23 and the like, and a problem of breaking of wire or the like is apt to occur by applying large stress to the conductor patterns 22 by pressing. Meanwhile, when the elastic modulus is lower than 1 MPa, the resin film or the like is easily displaced to cause displacement of the conductor pattern 22, and therefore it is hard to form the multilayer substrate 101.

According to the above-mentioned manufacturing method of the multilayer substrate and the structure, the multilayer substrate 101 can be produced by laminating the single-sided conductor patterned films 21, 21a and 21b, each of which has the conductor pattern 22 formed on the one side thereof, and the cover layers 36c and 36d to which an opening-formation process are performed to expose the electrodes 32 and 37, pressing the laminated structure while heating.

Therefore, the multilayer substrate 101 is composed only of the single-sided conductor patterned films 21, 21a and 21b, and the cover layers 36c and 36d, whereby it is unnecessary to form a substrate having conductor patterns formed at both sides thereof in midstream of the manufacturing process. Thus, the manufacturing process of the multilayer substrate 101 having the electrodes formed at both sides thereof is not complicated and can be reduced in cost.

Moreover, adhesions of each of the single-sided conductor patterned films 21, 21a and 21b, and the cover layers 36c and 36d can be performed all at once by one time of the pressing while heating. Therefore, the manufacturing method can be shortened, so that the manufacturing cost can be further reduced.

Incidentally, processing conditions such as the pressing while heating and materials of each part in this embodiment are the same as the first embodiment.

Moreover, in the third embodiment, the cover layers 36c and 36d as the resist films are laminated so as to cover the conductor patterns 22 at outermost layers except for portions (lands) to be electrodes 32 and 37. When the conductor patterns 22 at the outermost layers have wiring patterns connected to lands to be electrodes 32 and 37 in addition to the lands, as described above, the cover layers 36c and 36d should be laminated on the conductor patterns 22 to insulate and protect the wiring patterns. However, when the conductor patterns 22 are formed so as only to have the lands to be electrodes 32 and 37, and the wiring patterns connected to the electrodes 32 and 37 are constructed by the conductor patterns 22 in lower layers, the cover layers 36c and 36d may not be laminated on the conductor patterns 22. In this case, the cover layers 36c and 36d is not laminated, and the single-sided conductor patterned films 21, 21a and 21b is pressed while heating, thereby adhering with each other. Therefore, step for forming and laminating of the cover layers 36c and 36d can be omitted, so that the manufacturing process can be further simplified.

Furthermore, as shown in FIGS. 7A to 7E, with regard to single-sided conductor pattern films 21c located at outermost layers, conductor patterns 22 are formed as conductive foils 22a covering entire surfaces of resin films 23, a laminated single-sided conductor patterned films 21a, 21b, and 21c may be pressed and heated up through the conductive foils 22a. In such the way, pressing and heating is conducted through the conductive foils 22a by a heating-up press apparatus, whereby it is unnecessary to use a release sheet for preventing adhesion between the resin films 23 and the heating-up press apparatus.

Incidentally, after the single-sided conductor pattern films 21a, 21b and 21c are laminated, the conductive foils 22a disposed on the both sides of the multilayer substrate 101 are formed into patterns by etching. FIG. 7 shows an example in which the conductive foils 22a are formed into patterns only composed of the electrodes 32 and 37. However, the conductive foils 22a may be formed into patterns having wiring patterns in addition to the electrodes 32 and 37. In this case, however, after patterning, similarly to the second embodiment, cover layers 36a and 36b should be formed on the wiring patterns.

(Other Embodiments)

In the above-mentioned third embodiment, the via holes 24a and 24b have the approximately oblong circular shape, and when laminating the single-sided conductor patterned film, they are overlapped with each other so that the longitudinal axes of the via holes 24a and 24b are orthogonal to one another. However, the via holes may be formed in a radial shape having three or more linear portions that are radially extending from a center portion of the via hole, and may be overlapped with each other.

Figure 6A:
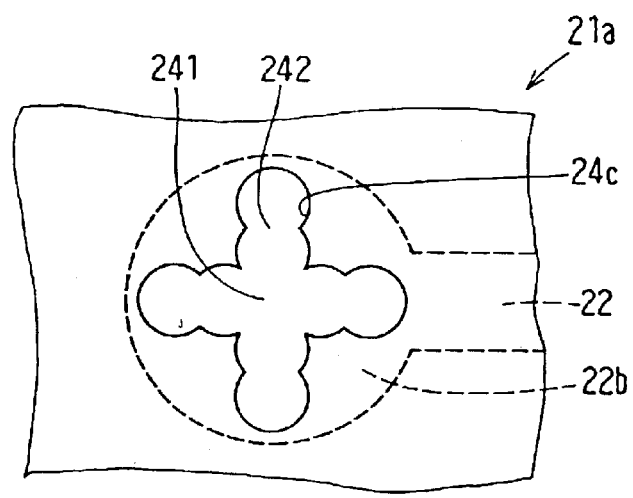
FIGS. 6A to 6C are plan views showing essential portions of the single-sided conductor patterned films and laminated condition thereof in the third embodiment of the present invention.
Figure 6B:
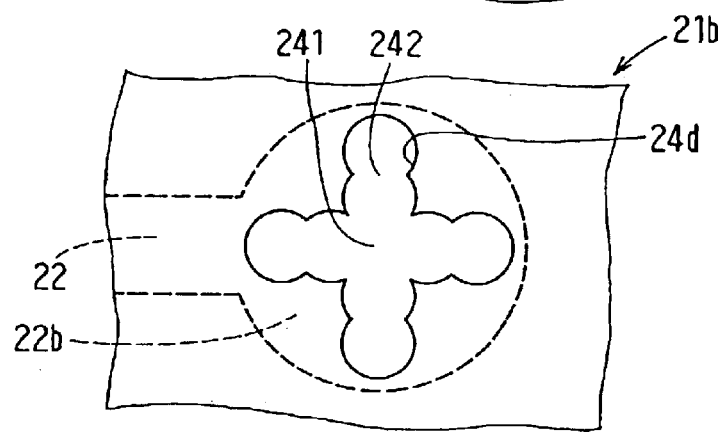
Figure 6C:
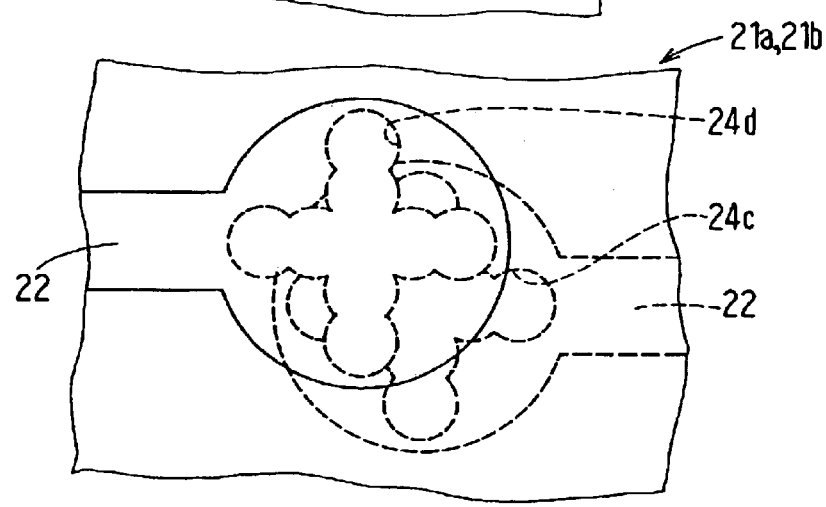
Figure 7A:
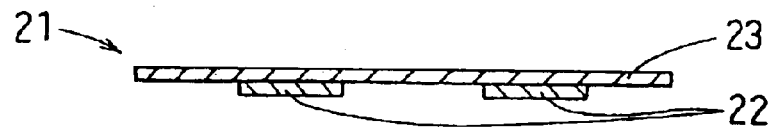
FIGS. 7A to 7E are cross sectional views in respective processes showing schematic manufacturing method of a multilayer substrate in the modified example of the third embodiment.
Figure 7B:
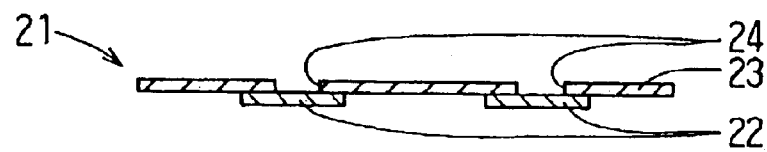
Figure 7C:
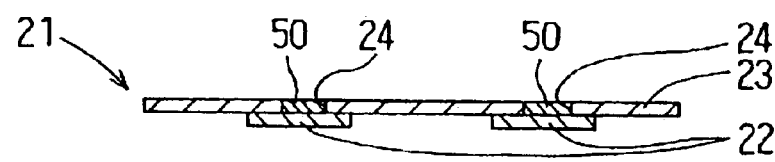
Figure 7D:
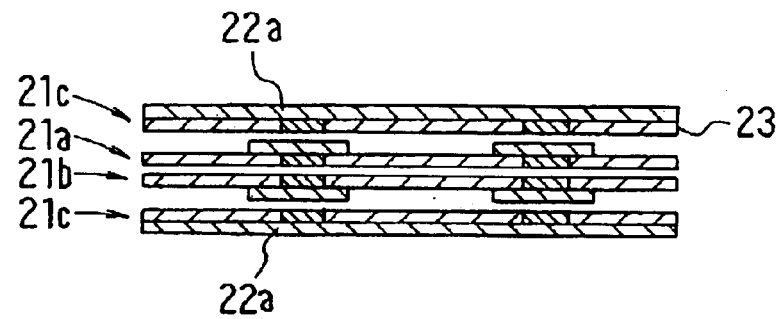
Figure 7E:
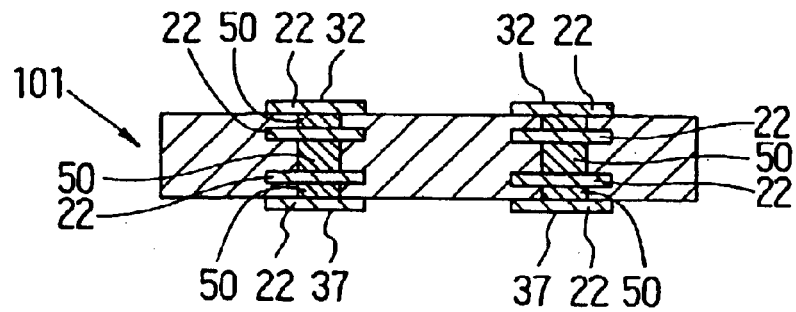

For example, as shown in FIGS. 6A and 6B, in single-sided conductor patterned films 21a and 21b, via holes 24c and 24d are formed in a radial, cross shape with four linear portions that are radially extending from a center portion 241 thereof, and as shown in FIG. 6C, may be overlapped with each other. As shown in FIG. 6C, even if relative locations of the single-sided conductor patterned films 21a and 21b are slightly displaced from each other, connection area can be secured between a conductive material 50 filled in the via hole 24c and a conductive material 50 filled in the via hole 24d.

Incidentally, when via holes formed in a radial shape are employed, there is a merit on which connection area can be easily secured when displacement occurs without controlling the arrangement-of the via holes as shown in the above-mentioned third embodiment in which the via holes in the approximately oblong circular shape are employed.

Incidentally, in the above-mentioned third embodiment, the via holes 24a and 24b have the approximately oblong circular shape, and when laminating the single-sided conductor patterned film, they are overlapped with each other so that longitudinal axes of the via holes 24a and 24b are orthogonal to one another. However, the via holes in the single-sided conductor patterned films 21a and 21b may have a larger diameter than that of the via hole in the single-sided conductor patterned films 21, and may be overlapped with each other.

Even if relative locations of the single-sided conductor patterned films 21a and 21b are slightly displaced from each other, connection area can be secured between conductive materials 50 filled in the via holes formed larger in diameter than the via hole 24 in the other layer c and a conductive material 50 filled in the via hole 24d.

Moreover, in the above-mentioned third embodiment, the via holes 24a and 24b formed in the single-sided conductor patterned films 21a and 21b only have the approximately oblong circular shape, the via hole provided in the single-sided conductor patterned film 21 also have the same shape. Moreover, all of the via holes may have the radial shape. According to these, in each interlayer, interlayer connection can be surely achieved while adhesion area between the land and resin film can be secured. Furthermore, there is a merit in which design work can be reduced by making via hole structure common.

Incidentally, in each of the above-mentioned embodiments, although, the resin film composed of a polyetheretherketone resin at 65 to 35 wt % and a polyetherimide resin at 35 to 65 wt % is employed as the resin film 23 and the cover layer 36, 36a, 36b, 36c and 36d, the material composed of the resin film is not limited to this, a film may be composed of a polyetheretherketone resin, a polyetherimide resin and filler, or can be only composed a polyetheretherketone (PEEK) or a polyetherimide (PEI).

Moreover, polyethylene naphthalete (PEN), polyethylene terephthalate (PET), polyethersulfone (PES), thermoplastic polyimide or so-called liquid crystal polymer or the like may be employed as the resin film and the cover layer. Alternatively, a laminated structure can be employed, which has a polyimide film and at least one of the PEEK, PEI, PEN, PET, PES, thermoplastic polyimide, and liquid crystal polymer that is laminated on the polyimide film. Such a resin film can be suitably employed, which can adhere by pressing with heat and has a necessary heat resisting properties in soldering process or the like as the following process.

Incidentally, when the resin film composed of the thermoplastic resin laminated on the polyimide film is employed, thermal expansion coefficient is in such a degree of 15 to 20 ppm and is close to thermal expansion coefficient of copper (17 to 20 ppm) that is mainly employed as wiring, and therefore, removal, camber or the like can be prevented from occurring.

Moreover, in each of the above-mentioned embodiments, although the interlayer connection material is the conductive paste 50, particulate material or the like can be employed as far as that can fill the via hole.

Further, in each of the above-mentioned embodiments, although the multilayer substrate 100 or 101 is four-layered substrate, the number of lamination should not be limited as far as the substrate has a plurality of conductor patterned layers.

While the present invention has been shown and described with reference to the foregoing preferred embodiment, it will be apparent to those skilled in the art that changes in form and detail may be made therein without departing from the scope of the invention as defined in the appended claims.

What is claimed is:

1. A manufacturing method of a multilayer substrate, which is made of laminated films and has electrodes formed at each of two principle surfaces, wherein the method comprises:

laminating single-sided conductor patterned films, each of which has a resin film and a conductor pattern, which is formed only on a single side of the resin film, to form a lamination, wherein the single-sided conductor patterned films include a first single-sided conductor patterned film, and the lamination is arranged such that the resin film of the first single-sided conductor patterned film forms an outermost surface of the laminated films and the conductor pattern of the first single-sided conductor patterned film is formed on an inner side of the resin film of the first single-sided conductor patterned film; and forming an opening in the resin film of the first single-sided conductor patterned film, so that one of the electrodes of the multilayer substrate is formed by the conductor pattern of the first resin film.

2. A manufacturing method of a multilayer substrate according to claim 1, further comprising:

forming a resist film on another side of the laminated films where the conductor pattern is disposed, so as to cover the conductor pattern;

forming a hole in the resist film at a region corresponding to a location of the conductor pattern where the electrode is to be formed.

3. A manufacturing method of a multilayer substrate according to claim 2, wherein the resist film is composed of the same material as the resin film.

4. A manufacturing method of a multilayer substrate according to claim 2, wherein the resin film in each of the single-sided conductor patterned films is composed of a thermoplastic resin, wherein:

after the single-sided conductor patterned films are laminated and the resist film is formed, the respective single-sided conductor patterned films and resist film are mutually adhered by pressing the both principal surfaces of the multilayer substrate while heating.

5. A manufacturing method of a multilayer substrate according to claim 1, wherein the resin film in each of the single-sided conductor patterned films is composed of a thermoplastic resin, wherein:

after laminating, the respective single-sided conductor patterned films are mutually adhered by pressing the both principal surfaces of the multilayer substrate while heating.

6. A manufacturing method of a multilayer substrate according to claim 5, wherein the substrate is heated up at a temperature where an elastic modulus of the thermoplastic resin is in a range from 1 to 1000 MPa in applying pressure and heat to the multilayer substrate.

7. A manufacturing method of a multilayer substrate according to claim 1, wherein:

each single-sided conductor patterned film, except a single-sided conductor patterned film having a resin film constituting the principal surface of the multilayer substrate, has a bottom-equipped via hole through which the conductor pattern as a bottom face is exposed and, which is filled with a conductive paste so that respective conductor patterns of adjacent single-sided conductor patterned films are electrically connected with each other.

8. A manufacturing method of a multilayer substrate, comprising:

laminating single-sided conductor patterned films in a stack, each of which has a resin film, a conductor pattern formed only on a single side of the resin film, and a via hole formed at a predetermined location and filled with an interlayer connection material, wherein an exposed conductor pattern of a one of the films located on a first side of the stack, is formed as a first conductive foil that entirely covers the resin film of the one film;

forming a second conductive foil on a surface resin film that is on a second side of the stack, so as to cover the surface resin film entirely; and patterning the first and second conductive foils to form first and second conductor patterns, wherein electrodes are formed by the first and second conductor patterns, and the lamination forms a multilayer substrate.

9. A manufacturing method of a multilayer substrate according to claim 8, wherein resist films are formed on the first and second conductor patterns, and the resist films are composed of the same material as the resin film.

10. A manufacturing method of a multilayer substrate according to claim 8, wherein the first and second conductive foils are patterned so that only lands, which serve as the electrodes, remain.

11. A manufacturing method of a multilayer substrate according to claim 8, wherein the resin film is composed of a thermoplastic resin, and after the conductive foils are formed on the sides of the stack, the respective single-sided conductor patterned films are mutually adhered by pressing the first and second sides of the stack while heating.

12. A manufacturing method of a multilayer substrate according to claim 11, wherein the multilayer substrate is heated to a temperature where an elastic modulus of the thermoplastic resin is in a range from 1 to 1000 MPa in applying pressure and heat to the multilayer substrate.

13. A manufacturing method of a multilayer substrate according to claim 8, wherein said interlayer connection material is a conductive paste, and said via hole has a bottom constructed by the conductor pattern, whereby respective conductor patterns of adjacent single-sided conductor patterned films are electrically connected with each other through the conductive paste.

14. A manufacturing method of a multilayer substrate, comprising:

laminating single-sided conductor patterned films, each of which has a resin film, a conductor pattern formed only on a single side of the resin film, and a via hole formed at a predetermined location and filled with an interlayer connection material; and adhering the single-sided conductor patterned films to each other using heat without adhesive to form a multilayer substrate, wherein:

an arbitrary two of the single-sided conductor patterned films are laminated so that surfaces thereof on which the conductor patterns are not formed face each other, while the remaining single-sided conductor patterned films are laminated in such a manner that a surface on which the conductor pattern is formed and a surface on which the conductor pattern is not formed face each other, whereby electrodes are formed by the conductive patterns at both sides of the multilayer substrate; and the resin film is composed of a thennoplastic resin;

the single-sided conductor patterned films are laminated after conductor patterns on all of the single-sided conductor patterned films are patterned into predetermined shapes; and;

the respective single-sided conductor patterned films are adhered to each other by pressing the multilayer substrate from opposite sides while heating.

15. A manufacturing method of a multilayer substrate according to claim 14, wherein resist films are formed on the conductor patterns disposed at both sides of the multilayer substrate, and the resist films are composed of the same material as the resin film.

16. A manufacturing method of a multilayer substrate according to claim 14, wherein the conductor patterns disposed at both sides of the multilayer substrate include only lands to form electrodes.

17. A manufacturing method of a multilayer substrate according to claim 14, wherein the resin film is composed of a thermoplastic resin, and after the conductor patterns exposed at both sides of the multilayer substrate are formed as conductive foils, respectively, which cover the resin films entirely, the respective single-sided conductor patterned films are adhered with each other by pressing the multilayer substrate from opposite sides while heating, and the electrodes are formed by patterning the conductive foils.

18. A manufacturing method of a multilayer substrate according to claim 14, wherein the substrate is heated to a temperature where an elastic modulus of the thermoplastic resin is in a range from 1 to 1000 MPa in applying pressure and heat to the multilayer substrate.

19. A manufacturing method of a multilayer substrate according to claim 14, wherein said interlayer connection material is a conductive paste, and each single-sided conductor patterned film has a bottom-equipped via hole through which the conductor pattern as a bottom face is exposed, wherein the via hole is filled with the conductive paste so that respective conductor patterns of adjacent single-sided conductor patterned films are electrically connected with each other through the conductive paste.

20. A manufacturing method of a multilayer substrate according to claim 14, wherein via holes of the arbitrary two films are formed approximately in an elliptical shape, and said elliptical-shaped via holes are overlapped with each other so that longitudinal axes thereof are orthogonal to one another.

21. A manufacturing method of a multilayer substrate according to claim 14, wherein via holes of the arbitrary two films are formed in a radial shape having three or more linear portions which radially extend from a center portion, and said radial-shaped via holes are overlapped with each other.

22. A manufacturing method of a multilayer substrate according to claim 21, wherein said radial-shaped via holes have a crisscross pattern with four linear portions.

23. A manufacturing method of a multilayer substrate according to claim 14, wherein via holes respectively formed in the single-sided conductor patterned films have an approximate circular shape, wherein the via holes of the two arbitrary films have a diameter larger than that of the via holes formed in the remaining single-sided conductor patterned films, and the via holes having a larger diameter are overlapped with each other when laminated.

24. A manufacturing method of a multilayer substrate, comprising:

laminating single-sided conductor patterned films, each of which has a resin film, a conductor pattern formed only on a single side of the resin film, and a via hole formed at a predetermined location and filled with an interlayer connection material; and adhering the single-sided conductor patterned films to each other to form a multilayer substrate, wherein:

an arbitrary two of the single-sided conductor patterned films are laminated so that surfaces thereof on which no conductor patterns are formed face each other, while the remaining single-sided conductor patterned films are laminated in such a manner that a surface on which the conductor pattern is formed and a surface on which no conductor pattern is formed face each other, whereby electrodes are formed by the conductive patterns at two, opposite sides of the multilayer substrate;

via holes of the single-sided conductor patterned films of which surfaces of the resin films having no conductive pattern face each other, are formed approximately in an elliptical shape; and said elliptical-shaped via holes are overlapped with each other so that longitudinal axes thereof are orthogonal to one another.

25. A manufacturing method of a multilayer substrate, comprising:

laminating single-sided conductor patterned films, each of which has a resin film, a conductor pattern formed only on a single side of the resin film, and a via hole formed at a predetermined location and filled with an interlayer connection material; and adhering the single-sided conductor patterned films to each other to form a multilayer substrate, wherein:

an arbitrary two of the single-sided conductor patterned films are laminated so that surfaces thereof on which no conductor patterns are formed face each other, while the remaining single-sided conductor patterned films are laminated in such a manner that a surface on which the conductor pattern is formed and a surface on which no conductor pattern is formed face each other, whereby electrodes are formed by the conductive patterns at two, opposite sides of the multilayer substrate;

via holes of the two arbitrary films are formed in a radial shape having three or more linear portions that radially extend from a center portion, and the radial-shaped via holes are overlapped with each other.

26. A manufacturing method of a multilayer substrate according to claim 25, wherein the radial-shaped via holes have a cross pattern with four linear portions.

27. A manufacturing method of a multilayer substrate, comprising:

laminating single-sided conductor patterned films, each of which has a resin film, a conductor pattern formed only on a single side of the resin film, and a via hole formed at a predetermined location and filled with an interlayer connection material; and adhering the single-sided conductor patterned films to each other to form a multilayer substrate, wherein:

an arbitrary two of the single-sided conductor patterned films are laminated so that surfaces thereof on which no conductor patterns are formed face each other, while the remaining single-sided conductor patterned films are laminated in such a manner that a surface on which the conductor pattern is formed and a surface on which no conductor pattern is formed face each other, whereby electrodes are formed by the conductive patterns at two, opposite sides of the multilayer substrate;

via holes respectively formed in the single-sided conductor patterned films have an approximate circular shape; and the via holes of the two arbitrary films have a diameter larger than that of the via holes formed in the remaining single-sided conductor patterned films, and the via holes having a larger diameter are overlapped with each other when laminated.

* * * * *